United States Patent
Jia et al.

(10) Patent No.: US 11,901,016 B2
(45) Date of Patent: Feb. 13, 2024

(54) FAST OPEN BLOCK ERASE IN NON-VOLATILE MEMORY STRUCTURES

(71) Applicant: SanDisk Technologies LLC, Addison, TX (US)

(72) Inventors: Xiaojia Jia, San Jose, CA (US); Jiacen Guo, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 120 days.

(21) Appl. No.: 17/732,747

(22) Filed: Apr. 29, 2022

(65) Prior Publication Data

US 2023/0352097 A1 Nov. 2, 2023

(51) Int. Cl.
| | |
|---|---|
| *G11C 16/16* | (2006.01) |
| *G11C 16/04* | (2006.01) |
| *G11C 16/34* | (2006.01) |
| *G11C 16/08* | (2006.01) |
| *H10B 41/27* | (2023.01) |
| *H10B 43/27* | (2023.01) |

(52) U.S. Cl.
CPC .......... *G11C 16/16* (2013.01); *G11C 16/0483* (2013.01); *G11C 16/08* (2013.01); *G11C 16/3445* (2013.01); *H10B 41/27* (2023.02); *H10B 43/27* (2023.02)

(58) Field of Classification Search
CPC ..... G11C 16/16; G11C 16/0483; G11C 16/08; G11C 16/3445; H10B 41/27; H10B 43/27
USPC ....................................... 365/185.22
See application file for complete search history.

(56) References Cited

U.S. PATENT DOCUMENTS

| | | | | |
|---|---|---|---|---|
| 2009/0273980 | A1* | 11/2009 | Doyle | G11C 16/28 365/185.11 |
| 2016/0217860 | A1* | 7/2016 | Lai | G11C 16/14 |

\* cited by examiner

*Primary Examiner* — Huan Hoang
(74) *Attorney, Agent, or Firm* — Dickinson Wright PLLC

(57) ABSTRACT

A method for performing an erase operation of a partially programmed memory block of a non-volatile memory structure. The method comprises: (1) applying an erase voltage bias level to a channel region of the memory block, (2) applying a word line voltage level to all programmed word line(s) of the memory block, (3) applying a "float" condition to all unprogrammed word line(s) of the memory block, and (4) applying an erase verify operation to all word line(s) of the memory block, wherein the "float" condition comprises omitting application of the word line voltage to the unprogrammed word line(s).

20 Claims, 14 Drawing Sheets

FAST OPEN BLOCK ERASE IN NON-VOLATILE MEMORY STRUCTURES

TECHNICAL FIELD

This disclosure relates to non-volatile memory storage systems in solid-state drives or other devices, including but not limited to flash drives or embedded/removable flash packages. More specifically, this disclosure relates to systems and methods for erase operations in non-volatile memory structures that address the phenomenon of a "deep erase" condition that may occur as a result of, for example, a partially programmed (i.e., "open") memory block of the memory structure.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices. Advances in non-volatile memory structures have led to significant increases in their storage density capability and a reduction in their power consumption, thereby lowering the per-bit and bit-per-chip cost.

Generally, a non-volatile memory device may be comprised of one or more arrays of individual memory cells. With respect to some flash memory types, each memory cell is comprised of a floating gate that is positioned above and isolated from a channel region of a semiconductor substrate, wherein the floating gate is positioned between the source and drain regions. Also, a control gate is provided over and isolated from the floating gate, wherein the threshold voltage ($V_{th}$) of the resulting transistor is controlled by and dependent upon an amount of charge that is retained on the floating gate. Specifically, in a switch-like manner, a minimum amount of voltage that must be applied to the control gate before the transistor is activated to permit conduction between its source and drain regions is, therefore, determined by the level of charge that is retained on the floating gate. As a result, bit-value data can be programmed onto and erased from the memory cell by precisely changing the level of charge on a floating gate in order to change the threshold voltage characteristic of the transistor. In an array structure, the memory cells are addressable by word lines (rows) and bit lines (columns).

One type of non-volatile memory storage that is defined by this general structure is referred to as NAND flash memory due to its electrical characteristics, which are based on the NAND logic gate.

As explained in detail below, the number of bits that can be stored in an individual memory cell is dependent upon the number of distinct voltage ranges that may be partitioned within the threshold voltage window of the memory cell. For example, to store one bit of data (referred to as a binary data), the possible threshold voltages of the memory cell are divided into two ranges, wherein the ranges are assigned as logical data "1" and "0" respectively. A memory cell of this type of storage density may be referred to as a "single-level cell" or SLC.

By further partitioning the threshold voltage window of a memory cell into additional distinct voltage ranges, multiple levels of information can be stored. Such a memory cell may be referred to as a "multi-state cell." For example, to store two bits of data, the threshold voltage window of a cell may be partitioned into four distinct voltage ranges (or states), wherein each range is assigned a certain bit value that is equal to, for example, "11," "10," "01," and "00." Accordingly, after an erase operation, the threshold voltage is negative and, therefore, may be defined as logic "11." Therefore, the positive threshold voltages may be used for the states of "10," "01," "00." A memory cell of this storage density may be referred to as, for example, a "multi-level cell" or MLC. In another example, to store three bits of data, the voltage threshold window of a cell may be partitioned into eight distinct voltage ranges (or states), wherein each range is assigned a certain bit value that is equal to, for example, "111," "110," "100," "010," "011," "000," "001," and "101." A memory cell of this storage density may be referred to, for example, as a "tri-level" or "triple-level cell" (TLC). In a further example, to store four bits of data, the voltage threshold window of a memory cell may be partitioned into 16 distinct voltage ranges (or states), wherein each voltage range is assigned a certain bit value that is equal to, for example, "1111," "1110," "1100," "1000," "0111," "0011," "0001," "0000," "0001," "1001," "1101," "1011," "0110," "0100," "0101," and "1010." A memory cell of this type of storage density may be referred to, for example, as a "quad-level cell" (QLC).

In addition to the increasing storage densities with respect to a single memory cell, advances in non-volatile memory array structures have led to memory cells being stacked in a vertical direction with respect to the semiconductor substrate, thus creating a three-dimensional array structure as opposed to a planar two-dimensional array structure.

The specific relationship between the data that is programmed into a memory cell and the threshold voltage levels of the memory cell depends upon the data encoding scheme that is adopted for the memory cells.

As described in detail below, a characteristic of the transistor-type behavior of a non-volatile memory is that in order to be programmed, the programmed cells must first be in an "erased" state. In other words, it is not possible to reprogram an already-programmed memory cell in order to store a new set of data without first performing an erase operation to place the memory cell into an "erased" state. Furthermore, according to the existing memory architecture, the erase memory operations occur at the memory block level, such that each time an erase operation is applied, it is uniformly applied to the entire memory block irrespective of whether every memory cell of the memory block is in a programmed state as a result of the current programming/erase cycle. However, the application of an erase operation to an otherwise unprogrammed memory cell may create a "deep erase" condition in which a number of positive charges are induced at a charge trapping region of the memory cell, thereby problematically skewing the "erased state" of the unprogrammed memory cell. This skewed "erased state" may negatively impact the efficiency, reliability, and power consumption of any future programming/erase cycles applied to the now compromised memory cell. Therefore, it would be beneficial to derive methods and systems for the discrete and discernable application of an erase operation to only the programmed memory elements of a memory block.

SUMMARY

Various embodiments include a method for performing an erase operation with respect to a partially programmed memory block of a non-volatile memory structure. The method comprises: (1) applying an erase voltage bias level to a channel region of the memory block, (2) applying a word line voltage level to all programmed word line(s) of the memory block, (3) applying a "float" condition to all unprogrammed word line(s) of the memory block, and (4) applying an erase verify operation to all word line(s) of the memory block, wherein the "float" condition comprises omitting application of the word line voltage to the unprogrammed word line(s).

Other embodiments include a memory controller that comprises a communication pathway that is configured to couple to a memory block of a non-volatile memory structure. The memory controller is configured to: (1) determine whether the memory block is partially programmed, (2) if the memory block is determined as partially programmed, initiate an erase operation with respect to the memory block by applying an erase voltage bias level to a channel region of the memory block, (3) apply a word line voltage level to all of the programmed word line(s) of the memory block, (4) apply a "float" condition to all of the unprogrammed word line(s) of the memory block, and (5) apply an erase verify operation to all word line(s) of the memory block, wherein the "float" condition comprises omitting the application of the word line voltage level to the unprogrammed word line(s).

Additional embodiments include a non-volatile memory system comprising a partially programmed memory block and a memory controller that is coupled to the memory block, the memory controller: (1) initiating an erase operation of the memory block, (2) applying an erase voltage bias level to a channel region of the memory block, (3) applying a word line voltage level to all programmed word line(s) of the memory block, (4) applying a "float" condition to all of the unprogrammed word line(s) of the memory block, and (5) applying an erase verify operation to all word line(s) of the memory block, wherein the "float" condition comprises omitting application of the word line voltage level to the unprogrammed word line(s).

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which.

DETAILED DESCRIPTION

Figure 1:
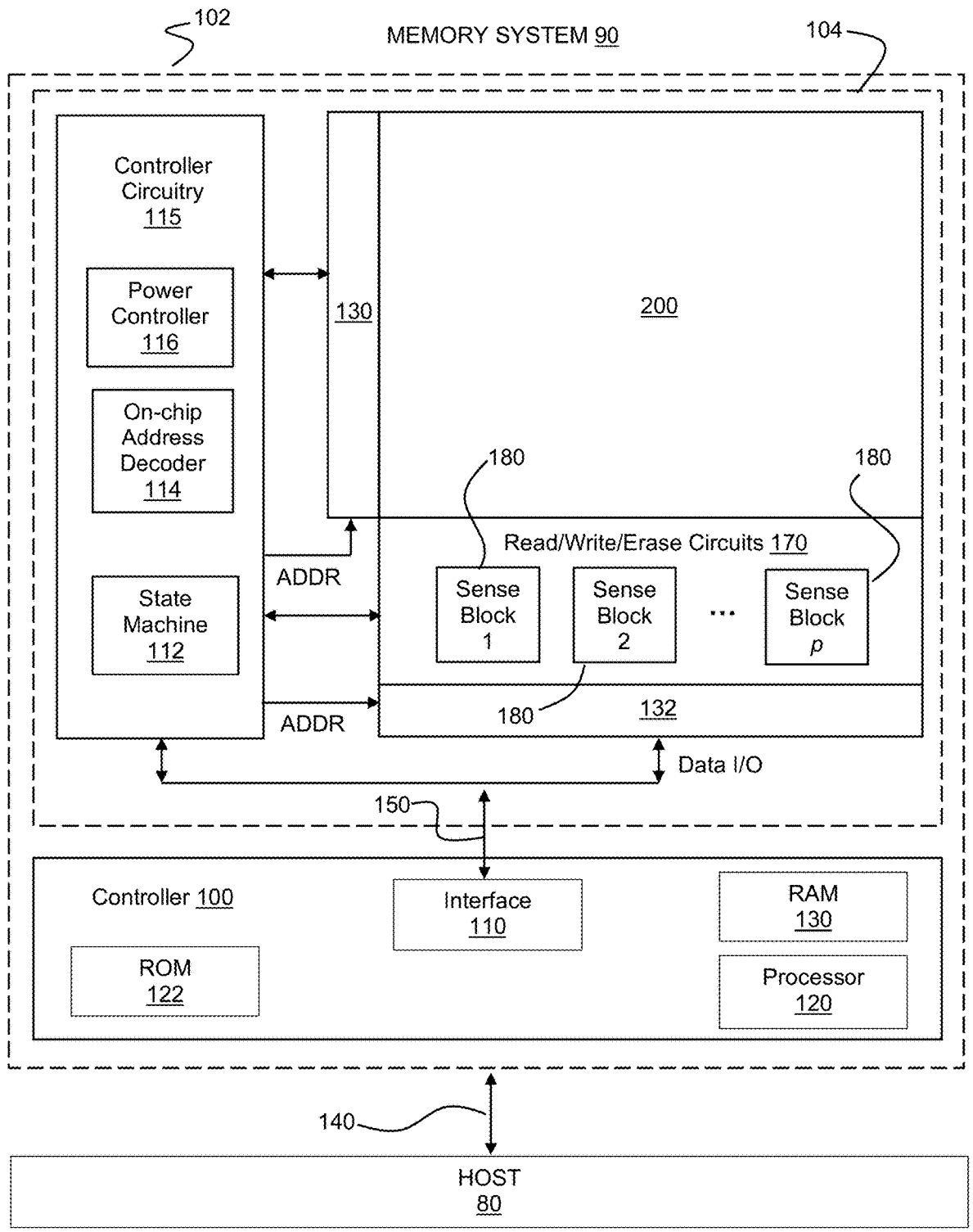
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electro-magnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays 200 of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, and additional components. The controller 100 may, for example, be in the form of one or more application-specific integrated circuits (ASIC) in which the components included in such an ASIC depend on the particular application.

Figure 2:
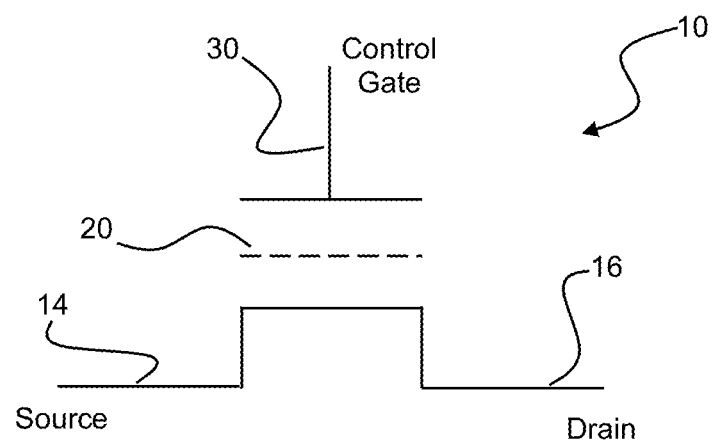
FIG. 2 schematically depicts a non-volatile memory cell, in accordance with exemplary embodiments.

With respect to the memory array 200 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a respective bit line (BL).

Figure 3A:
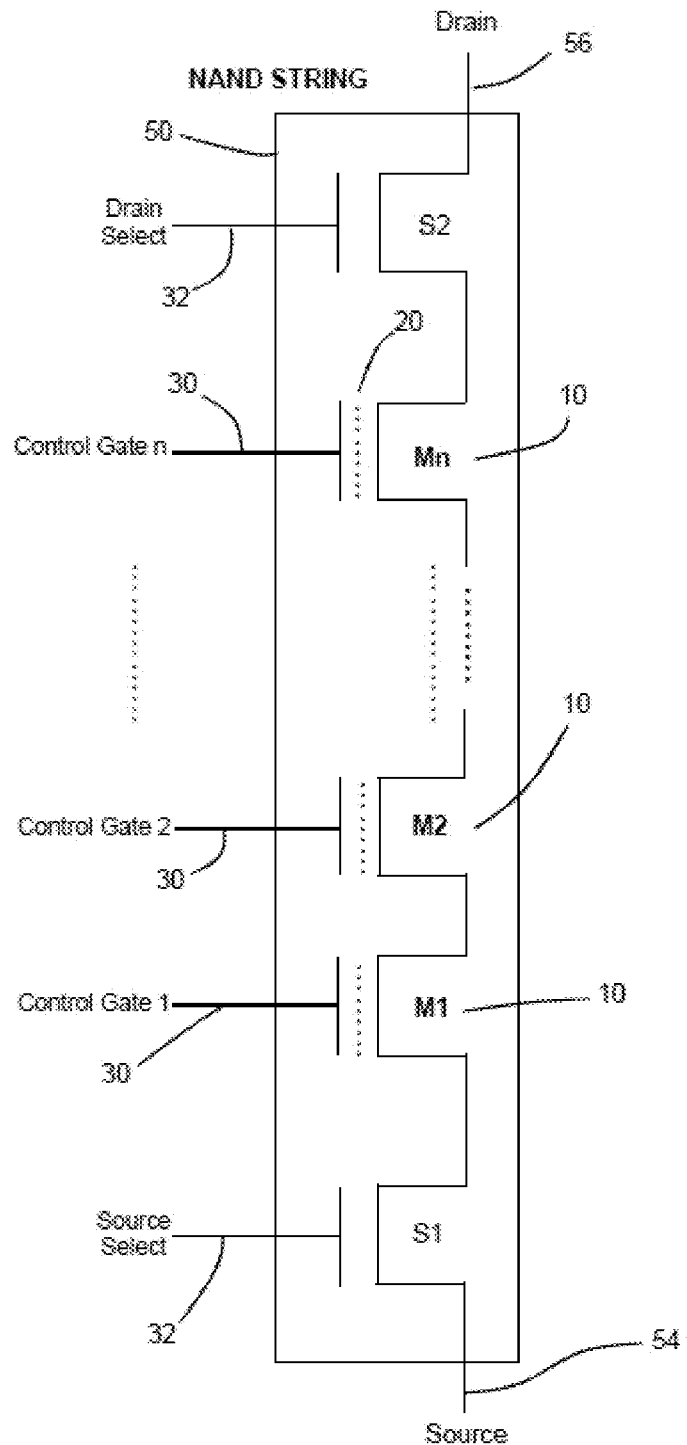
FIG. 3A schematically depicts a series of NAND-type memory cells organized into a string, in accordance with exemplary embodiments.

According to certain exemplary embodiments, the individual memory cells 10 are organized into strings in which the memory cells are placed in series. For example, depicted in FIG. 3A is an exemplary embodiment of a string 50 comprising NAND-type memory cells in which the series of the cells' respective transistor elements M1, M2, . . . , Mn (wherein "n" may equal 4, 8, 16, or higher) are daisy-chained with respect to their sources and drains. Further, as mentioned above with respect to FIG. 2, each memory cell's transistor 10 in the string 50 has a charge storage element 20 (e.g., a floating gate) for storing a certain amount of charge so as to represent an intended memory state of that cell, wherein each memory transistor 10 comprises a control gate 30 that allows control over the read and write memory operations. Present at the source terminal 54 and the drain terminal 56 of the string 50 are select transistors S1, S2 that control the transistor's connection to the outlying memory array. Specifically, when the source select transistor S1 is turned on, the source terminal 54 of the string 50 is coupled to a source line (SL). Likewise, when the drain select transistor S2 is turned on, the drain terminal 56 is coupled to a bit line (BL) of the memory array.

Figure 3B:
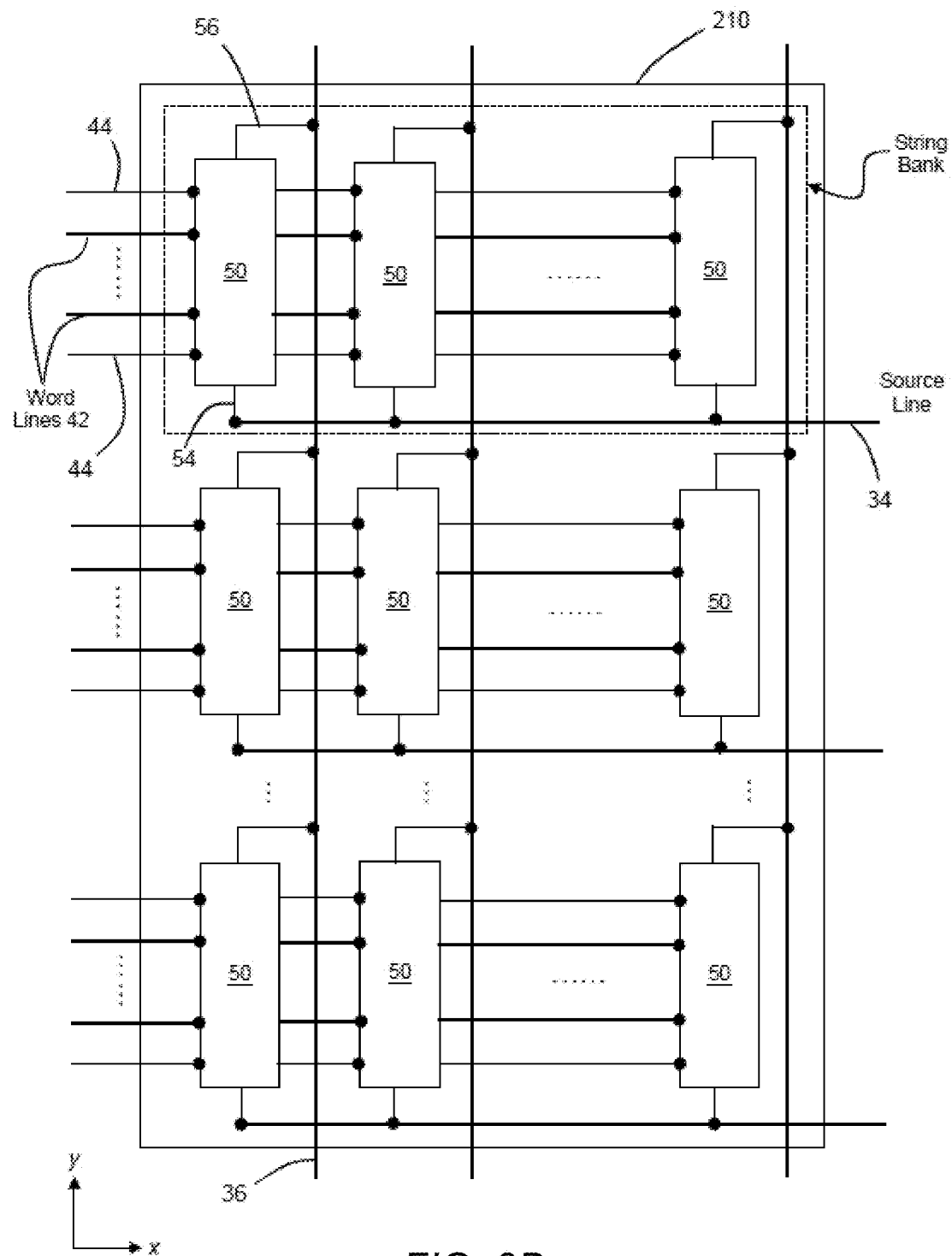
FIG. 3B schematically depicts a two-dimensional array of memory cells, comprising a plurality of NAND-type strings, such as the type depicted in FIG. 3A, in accordance with exemplary embodiments.

Expanding outward a hierarchical level, FIG. 3B is a schematic diagram depicting an exemplary embodiment of a memory array 200 (such as memory array 210) comprised of a plurality of NAND strings 50 of the type illustrated in FIG. 3A. Along each column of NAND strings 50, a bit line (BL) 36 is coupled to the drain terminal 56 of each NAND string 50. In addition, along each bank of NAND strings 50, a source line (SL) 34 is coupled to the source terminals 54 of each NAND string 50. Further, the control gates 30 of the memory transistors 10 in a row of memory cells in the bank of NAND strings 50 are connected to the same word line (WL) 42. Therefore, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, an electrically conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provide control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines (WL) 42 and select lines 44 of the bank of NAND strings 50.

Figure 4:
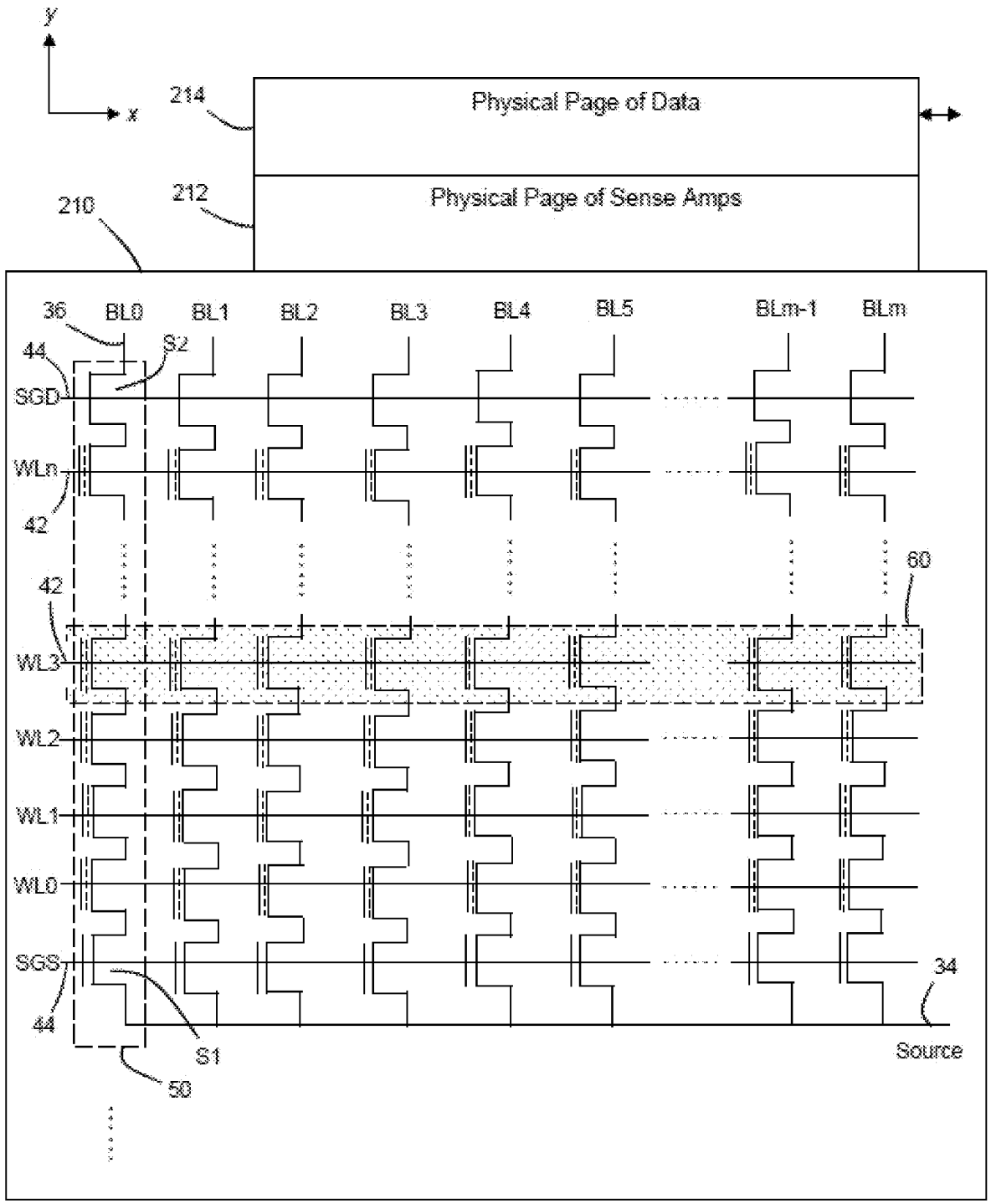
FIG. 4 depicts a page of memory cells being sensed or programmed in parallel, and in relation to a memory array organized in a NAND-type configuration, in accordance with exemplary embodiments.

Referring now to FIG. 4, there is depicted a detailed illustration of one bank of NAND strings 50 of a memory array 210 according to an exemplary embodiment thereof. This view is particularly useful in visualizing a row-by-row configuration of the memory array 210, wherein each row may be referred to as a "page." Accordingly, a physical page (e.g., page 60 denoted in FIG. 4) is a group of memory cells 10 that is enabled to be sensed or programmed in parallel. In fact, in such a configuration, a page is the smallest unit of the memory device that may be programmed or written to. Programming of a page is accomplished by a corresponding page of sense amplifiers (SA) 212, wherein each sense amplifier may be coupled to a respective NAND string 50 via a bit line (BL) (see e.g., the bit lines BL0, BL1, BL2, . . . , BLm-1, and BLm, as depicted in FIG. 4). Thus, a page 60 is enabled by the control gates of the plurality of memory cells 10 in page 60, which are connected to a common word line (WL) 42, and each memory cell 10 of the page 60 is accessible by a sense amplifier via a bit line 36. Accordingly, when programming or sensing a page 60 of memory cells 10, a programming or sensing voltage is respectively applied to the common word line (e.g., word line WL3 with respect to page 60) together with the appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page.

Figure 5:
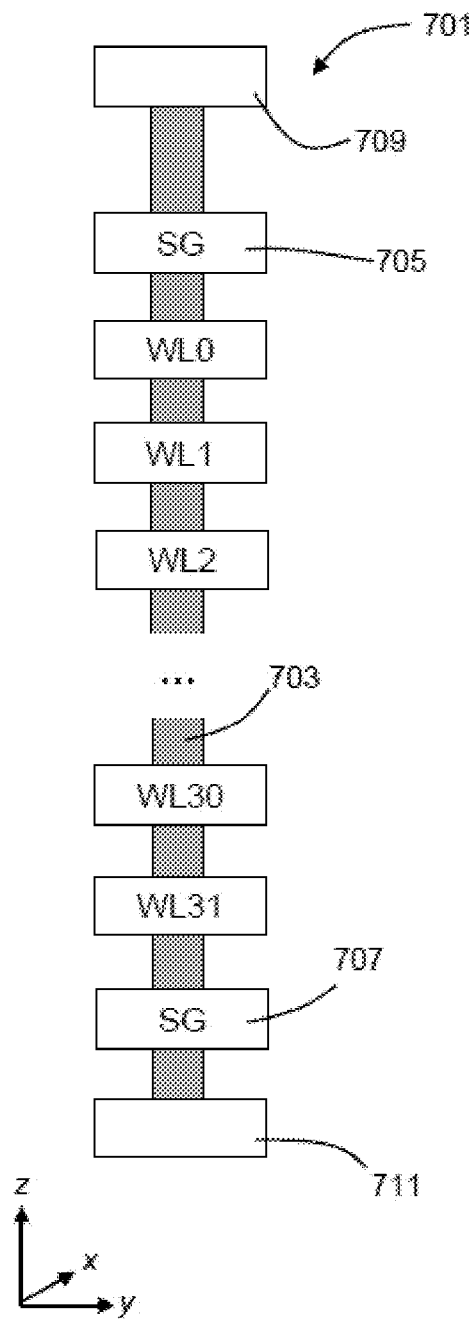
FIG. 5 depicts a vertical NAND-type string, in accordance with an exemplary embodiment.

In FIGS. 3A-3B and 4 and the foregoing corresponding description, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). As a result, three-dimensional memory structures increase the storage density but consume less chip surface. For example, in FIG. 5 there is depicted an exemplary embodiment of a 3D NAND-type string 701, which is operated in a similar manner as a two-dimensional NAND-type string, such as the NAND-type string 50 described above. In this configuration, a memory cell is formed at the juncture of a vertical bit line (BL) (see e.g., the local bit line 703) and a word line (see e.g., word lines WL0, WL1, etc.), wherein a charge trapping layer located between the local bit line 703 and an intersecting word line (WL) stores charge. In order to form such a vertical string 701, stacks of word lines are formed and memory holes are etched at the appropriate locations where the cells are to be formed, wherein each memory hole is lined with a charge trapping layer and filled with a suitable local bit line/channel material. Additionally, dielectric layers are included for the necessary isolation. Further, located at either end of the NAND-type string 701 are select gates 705, 707, which allow for the selective connection to, or isolation from, external elements 709, 711 that include, for example, conductive lines (such as common source lines or bit lines) that serve large numbers of strings 701 of a memory array. In the particular embodiment shown in FIG. 5, the vertical NAND-type string 701 has 32 memory cells (i.e., at the juncture between the local bit line 703 and word lines 0 through 31) that are connected in series. However, a NAND-type string 701 may comprise any suitable number of memory cells.

Referring back to the overall architecture of a memory system that is, for example, depicted in FIG. 1, there is shown a schematic depiction of a typical arrangement of an example memory device 102. In this particular embodiment, the memory device 102 comprises one or more memory die 104 wherein each memory die 104 may include a two- or three-dimensional memory structure 200, such as the two- and three-dimensional memory arrays described above with respect to FIGS. 3A-3B, 4 and 5, as well as the associated control circuitry 115 and read/write/erase circuits 170. For example, memory structure 200 may comprise a monolithic three-dimensional memory structure in which multiple memory levels are formed above (rather than in) a single substrate, such as a wafer, without any intervening substrates. Further, the memory structure 200 may be comprised of any type of non-volatile memory monolithically formed in one or more physical levels of arrays of memory cells having an active area that is disposed above a silicon substrate. Such a memory structure may be in a non-volatile memory device in which the circuitry that is associated with the operation of the memory cells may be above or within the substrate.

Still referring to FIG. 1, the memory structure 200 is accessible by the read/write/erase circuits 170 by way of a row decoder 130 and a column decoder 132. As previously described, individual memory cells of the memory structure 200 are addressable via a set of selected word lines (WL) and bit lines (BL). Specifically, the row decoder 130 selects the one or more word lines and the column decoder 132 selects one or more bit lines in order to apply the appropriate voltages to the respective gates of the addressed memory cells. As shown in FIG. 1, the read/write/erase circuits 170 comprise multiple sense blocks 180 (Sense Block 1, Sense Block 2, . . . , Sense Block p) that are connectable via bit lines to the memory elements of the memory structure 200. The sense blocks 180 allow memory cells connected to a common word line (referred to as a "page" of memory cells) to be read or programmed in parallel. In some embodiments, a controller 100 is included in the same memory device 102 as the one or more memory die 104 or, in other embodiments, the controller 100 may be located separate from the memory die 104. In some embodiments, the controller 100 may be on an entirely different die from the memory die 104. Further, in certain embodiments, each memory die 104 may have its own controller 100 or, in other embodiments, one controller 100 may communicate amongst multiple memory die 104. According to the exemplary embodiment of FIG. 1, commands and data are transferred between the host 80 and the controller 100 by way of a data bus 140, and between the controller 100 and the one or more memory die 104 via lines 150. According to certain embodiments, the memory die 104 include input and/or output (I/O) pins that connect to the lines 150.

According to certain exemplary embodiments, the controller 100 manages data that is stored in the memory device 102 and communicated with the host 80. The controller 100 may have various functionalities that include, for example, formatting the memory to ensure it is operating properly, map out bad memory components, and allocate spare memory cells to be substituted for future failed cells. In operation, when a host 80 needs to read data from or write data to the memory, it will communicate with the controller 100. If the host provides a logical address to which data is to be read/written, the controller 100 can convert the logical address received from the host to a physical address in the memory. Alternatively, the host can provide the physical address. In further embodiments, the controller 100 can perform various memory management functions such as, but not limited to, wear leveling (distributing writes in order to avoid repeatedly writing, and thereby wearing out, specific blocks of memory) and garbage collection in which, for example, valid pages of data are culled (or moved) from a full memory block in order for the entire block to be erased and reused.

The components of the controller 100 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. In some exemplary embodiments, each module may comprise an application-specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 100 to perform the desired functions.

Additionally, the control circuitry 115 cooperates with the read/write/erase circuits 170 in performing memory operations (e.g., read, program, erase, etc.) with respect to memory structure 200, and includes, for example, a state machine 112, an on-chip address decoder 114, and a power control module 116. The state machine 112 provides die-level control of memory operations that include, for example, programming certain memory cells to different final target states. Further, the on-chip address decoder 114 provides an address interface between the addresses used by host 80 or controller 100 to the hardware address used by the row and column decoders 130, 132. The power control module 116 controls the power and voltages that are supplied to the word lines and bit lines during memory operations. As such, the power control module 116 may comprise drivers for word line layers (with respect to a 3D memory configuration), select transistors, and source lines. Also, the power control module 116 may include charge pumps for generating voltages. The sense blocks 180 include the bit line drivers. Any one or any combination of control circuitry 115, state machine 112, decoders 114/130/132, power control module 116, sense blocks 180, read/write/erase circuits 170, and/or controller 100 can be considered a control circuit that performs the functions described herein.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 3A-3B and 4, respectively, in the vertical direction that is perpendicular to the x-y plane (i.e., the z direction), such that each y-z plane of the three-dimensional structure corresponds to the page structure of FIG. 4, wherein each plane is at differing locations along the x axis. As a result, the global bit lines (e.g., BL0, ..., BLm, of FIG. 4) each run across the top of the memory structure to an associated sense amplifier (e.g., SA0, ..., SAm). Accordingly, the word lines (e.g., WL0, ..., WLn, of FIG. 4), and the source and select lines (e.g., SSL0, ..., SSLn, and DSL0, ..., DSLn, respectively) extend in the x direction, with the bottom of each NAND string (e.g., string 50) connected to a common source line.

Figure 6:
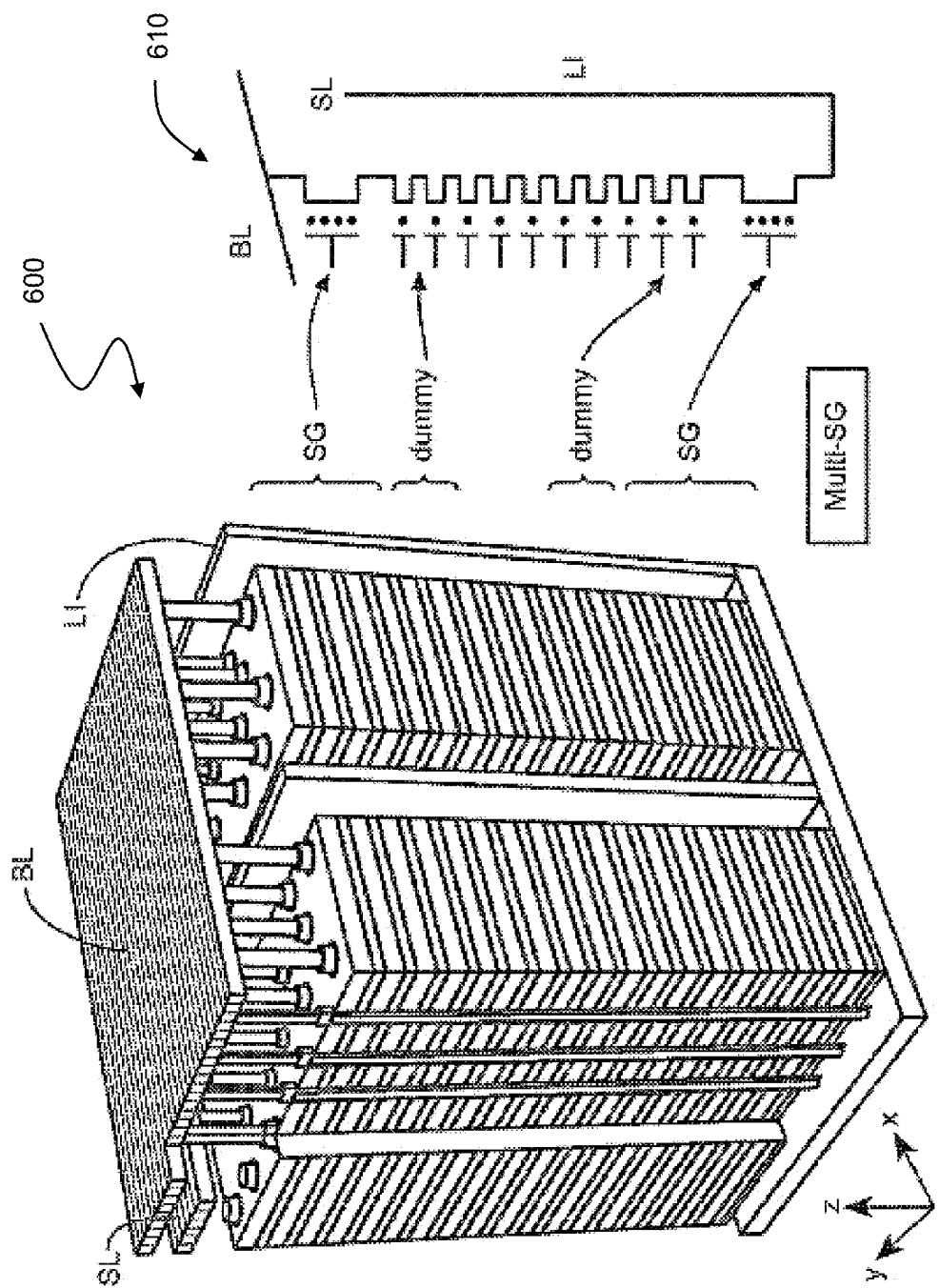
FIG. 6 is a perspective view of a representative subsection of a monolithic three-dimensional NAND-type memory array, in accordance with exemplary embodiments.

Referring now to FIG. 6, there is depicted an oblique perspective view of an example subsection of an embodiment of a three-dimensional NAND memory array 600 of the Bit Cost Scalable ("BiCS") type in which one or more memory device levels is formed above a single substrate. The example subsection corresponds to two of the page structures shown in FIG. 3B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the array 600, the NAND strings are connected along global bit lines (BL) that span multiple of these subsections of the array 600 that run in the x-direction. In addition, global common source lines (SL) also run across multiple subsections of the memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 600. Depicted on the right side of FIG. 6 is a schematic representation of the fundamental elements of one of the vertical NAND strings 610 of the memory array 600. Similar to the NAND string 50 of FIG. 3A, the string 610 is comprised of a series of interconnected memory cells. The string 610 is connected to an associated bit line (BL) through a drain select gate (SGD). A source select gate (SDS) connects the string 610 to a global source line (SL) through an associated local source line (LI). Further included in this particular embodiment are several dummy cells located at the ends of the string 610. Due to their proximity to select gates (SGD, SDS) and, thereby, their susceptibility to disturbs, the dummy cells are not used to store user data.

Figure 7:
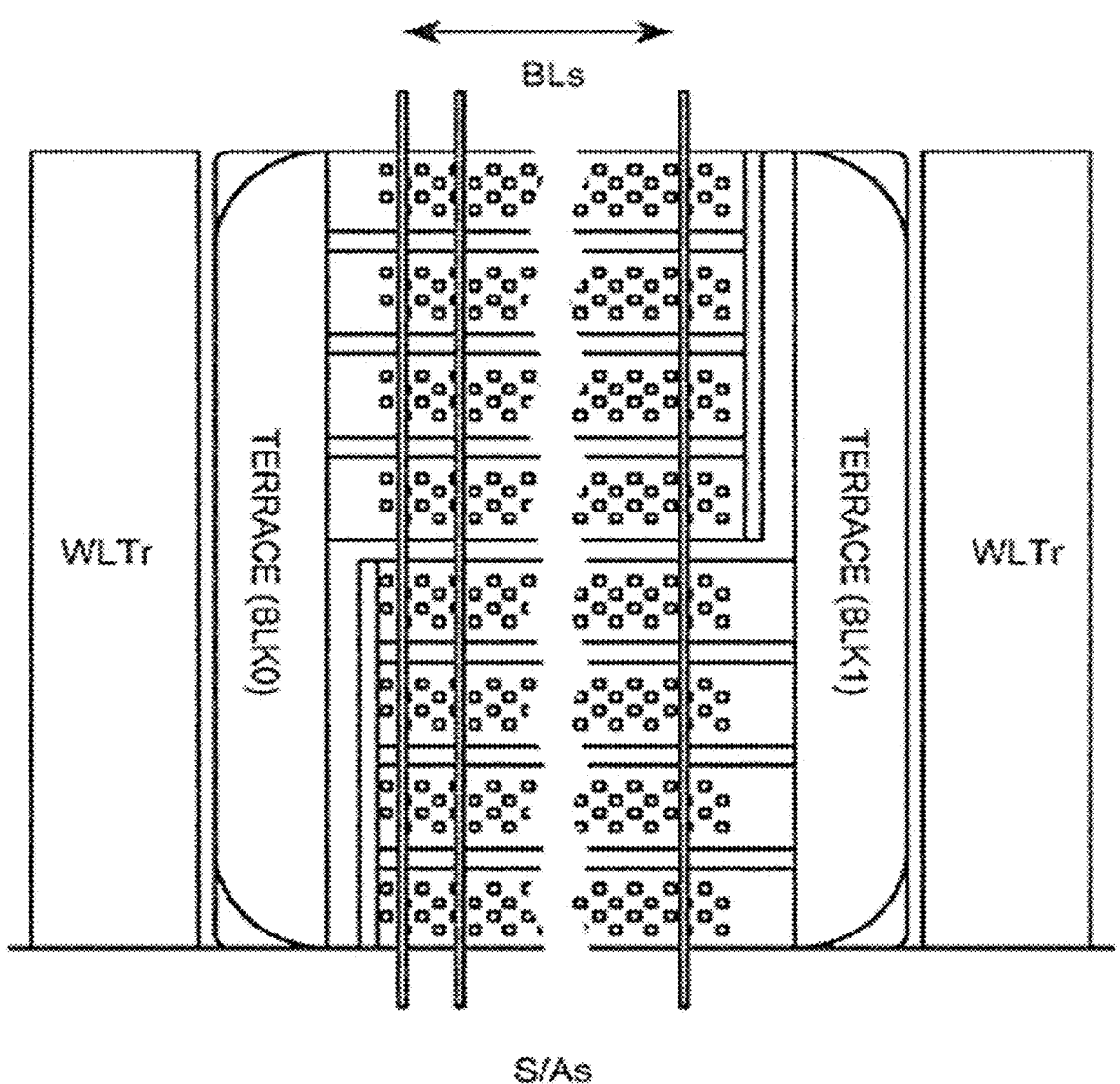
FIG. 7 is a top view of two representative blocks of the memory array of FIG. 6, in accordance with exemplary embodiments.

Turning to FIG. 7, there is shown a top view of two representative blocks (i.e., BLK0 and BLK1) of the array structure 600 of FIG. 6. According to this particular embodiment, each block is comprised of four extensions that extend from left to right. Further, the word lines and the select gate lines of each level also extend from left to right, wherein the word lines of the different extensions of the same block are commonly connected at a "terrace" from which they receive their various voltage levels by way of word line select gates (WLTr). It should also be noted that the word lines of a given layer of a block may be commonly connected on the far side from the terrace. Also, the selected gate lines can be individual, rather than common, for each level, thereby allowing for each extension to be individually selected. In addition, the bit lines (BLs) run vertically as depicted, and connect to the sense amplifier circuits (SAs) where, depending on the embodiment, each sense amplifier can correspond to a single bit line or be multiplexed to several bit lines.

Figure 8:
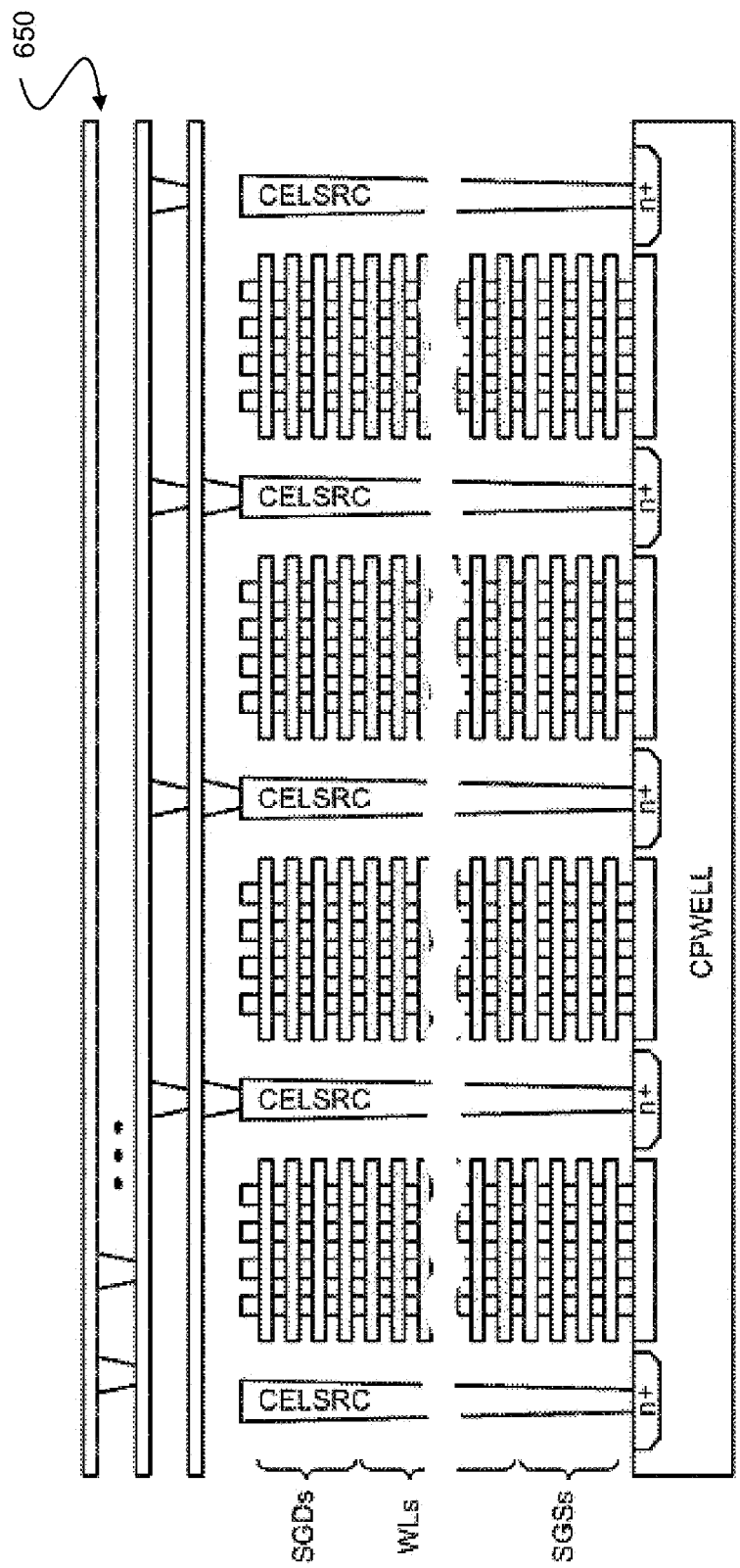
FIG. 8 is a side view of a representative block of the memory array of FIG. 6, in accordance with exemplary embodiments.

The side view provided in FIG. 8 shows the four extensions of an individual block 650 of the array structure 600 of FIG. 6 in greater detail. According to this particular embodiment, select gates (SGD, SDS) at either end of the NAND strings are formed with four layers, with the word lines (WLs) therebetween, all formed over a CPWELL. Accordingly, in order to select a given extension, the voltage level (VSG) of the select gates is set and the word lines (WLs) are biased according to the operation, either at a read voltage (VCGRV) for the selected word lines (WLs), or at a read-pass voltage (VREAD) for the non-selected word lines (WLs). The non-selected extensions may then be cut off by setting their select gates accordingly.

Figure 9A:
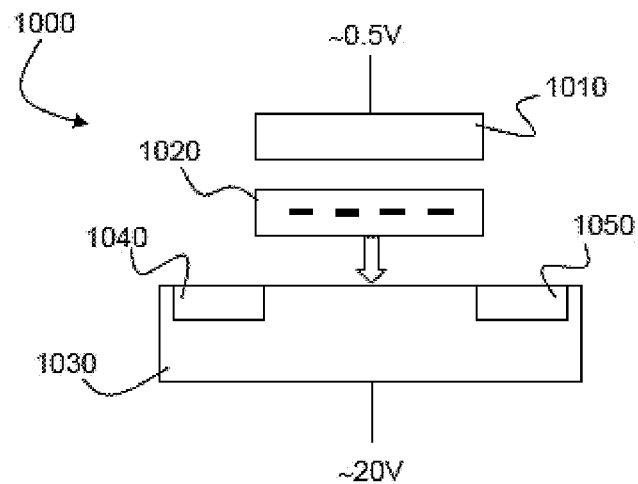
FIG. 9A illustrates a memory erase operation for a programmable threshold transistor of a two-dimensional memory structure, in accordance with exemplary embodiments.
Figure 9B:
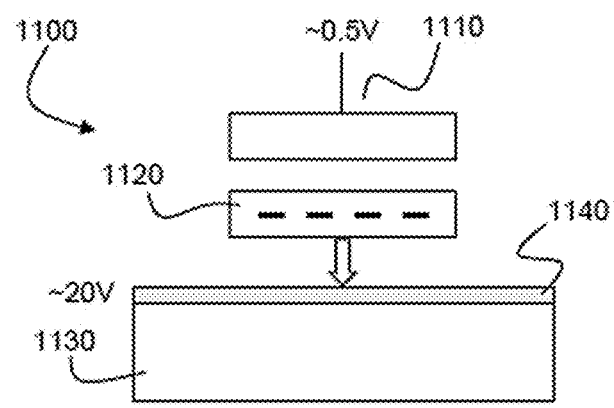
FIG. 9B illustrates a memory erase operation for a programmable threshold transistor of a three-dimensional memory structure, in accordance with exemplary embodiments.

Returning now to the programming and erase memory operations with respect to non-volatile memory, these two operations may be generally described in the following manner. As described above, each cell comprises a floating gate MOS transistor or charge trapping layer, wherein the floating gate (FG) or charge trapping layer is an electrically isolated conductor. Accordingly, when programming a memory cell, a relatively high voltage is applied to the control gate of the memory cell (in the case of a two-dimensional array) or the appropriate word line (WL) (in the case of a three-dimensional array) and, as a result, electrons are injected into the floating gate by means of, for example, Fowler-Nordheim (F-N) Tunneling. Data bits are then stored by trapping charge on the floating gate, wherein the logic value is defined by its threshold voltage and the amount of electrical charge stored. Conversely, to erase a memory cell, electrons in the floating gate are removed by, for example, a process referred to as quantum tunneling, to the source and/or the semiconductor substrate. More specifically, in some exemplary embodiments, electrons are removed from the floating gate or charge trapping layer by applying a low voltage to the control gate and increasing the channel voltage to a high voltage, thereby creating an electric field that causes electrons to be pushed back into the semiconductor substrate. This process is diagrammatically illustrated in FIG. 9A, which generally depicts a two-dimensional NAND-type memory cell configuration 1000 comprising a control gate 1010, a floating gate 1020, and the underlying semiconductor substrate 1030 (e.g., polysilicon) comprising the memory cell's source and drain terminals (see 1040 and 1050, respectively). According to this particular embodiment, a relatively low voltage (0.5 V, for example) is applied to the control gate 1010 and a relatively high voltage VERA (20 V, for example) is applied to substrate body 1030, causing the electron charges (−) trapped at the floating gate 1020 to be pushed back into substrate 1030. Similarly, depicted in FIG. 9B is a diagrammatic view of a general erase process with respect to a three-dimensional NAND-type memory cell configuration 1100, according to an exemplary embodiment. Here, a relatively low voltage (e.g., ~0.5 V) is applied to the appropriate word line 1110 and a relatively high voltage VERA (e.g., ~20 V) is applied to a channel 1140 of the memory structure 1130, the channel being comprised of holes. As a result, the electron charges (−) are pushed out of the charge trapping layer 1120.

As described above, global bit lines (BLs) of a memory array structure connect the memory cells to the sense amplifiers used in the memory (sensing) operations. For example, as described above with respect to the exemplary embodiment illustrated in FIG. 7, each NAND string is connected to a bit line and the sense amplifiers (SAs) are located on the periphery of the array 600, wherein each sense amplifier connects to a single bit line. During erase operations in some memory circuit designs, such as the exemplary BiCS-type array embodiment depicted in FIGS. 6-8, the associate bit lines (BLs) will couple to the erase voltage VERA, which can be in the relatively high voltage range of 20V to 24V, thereby taking the bit lines to a high voltage. However, the sense amplifiers (SAs) generally operate at lower voltages, such as VSS (0V), the high logic level (VDD≈ 2-3V), and, in some embodiments, a VDDSA (used in pre-charging bit lines for sensing operations) that is in the 4-5V range. Therefore, additional circuitry is implemented in order to protect the transistors of the sense amplifiers (SAs) from being damaged by the high erase voltage, and to protect against bit lines shorting to the adjacent low voltage circuitry. For example, in certain embodiments, each of the bit lines may be connected to an associated sense amplifier through a switch by an internal part of the bit line such that, during an erase operation, the switch is shut off thereby protecting the sense amplifier circuitry and containing the high voltage.

As mentioned above, depending upon the nature of the memory structure and its data storage assignment and type of usage, it is possible that one or more word line(s) of a memory block of the memory structure does not undergo a programming operation over the course of a given programming/erase cycle and, therefore, remains in an "erased" state. Accordingly, a memory block that is not fully programmed may be referred to as an "open" memory block. Conversely, a memory block in which all of its word line(s) are in a programmed state may be referred to as a "closed" memory block. Despite the flexibility that is afforded by the ability to program a memory block only partially, such an "open" memory block may present certain challenges to the overall performance characteristics of the memory structure, including with respect to, for example, the reliability, efficiency, and power consumption. Referring now to FIGS. 10-13, there is provided a series of depictions that demonstrate various challenges of an "open" memory block.

Figure 10:
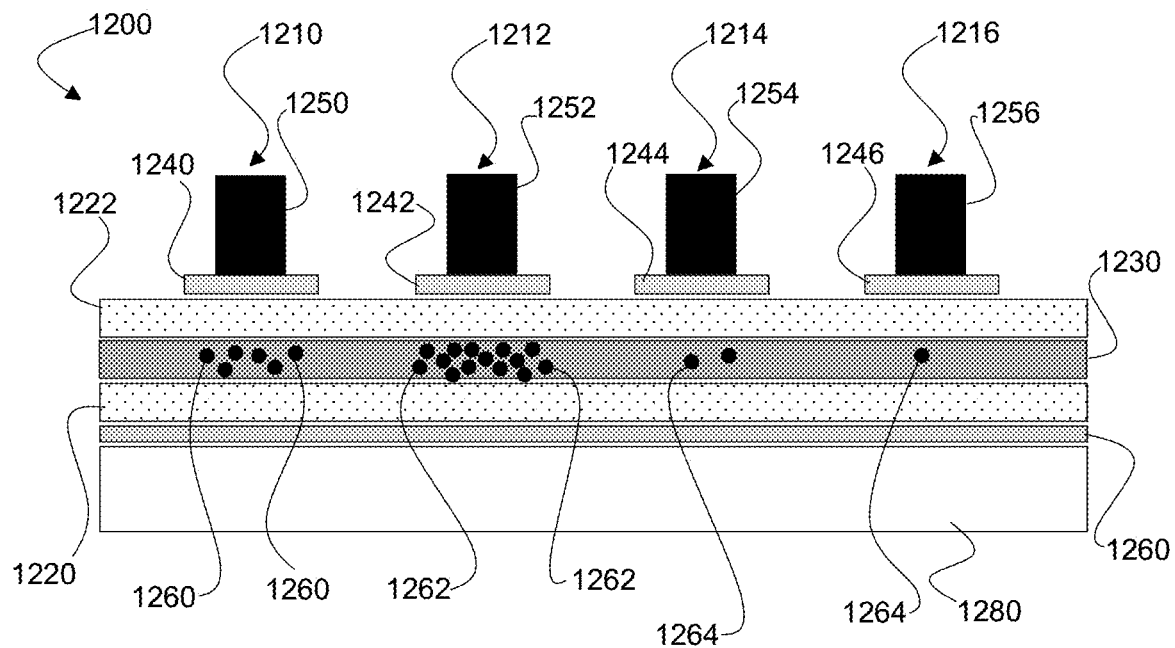
FIG. 10 schematically depicts a section of a partially programmed three-dimensional NAND-type memory block, in accordance with exemplary embodiments.

Beginning at FIG. 10, there is generally depicted, according to an exemplary embodiment, a representative section 1200 of a three-dimensional NAND-type memory block. According to this particular depiction, section 1200 comprises four memory cells 1210, 1212, 1214, and 1216. Each memory cell comprises a control gate, 1240, 1242, 1244, and 1246, respectively, at an intersection with a respective word line (WL) 1250, 1252, 1254, and 1256. Further, section 1200 may be comprised of one or more material layers that may include, for example, a charge trapping layer 1230 that may be disposed between two insulating layers 1220, 1222, a channel 1260, and an underlying semiconductor substrate 1280. The two insulating layers 1220, 1222 may be comprised of, for example, an oxide material. A specific programming order of the memory cells 1210, 1212, 1214, and 1216 may be pre-determined according to an assignment protocol that could be stored, for example, within the memory device itself. According to this particular embodiment, the programming order, with respect to section 1200, commences at word line 1250 and, if continuing onward therefrom, proceeds to the right (i.e., to word line 1252, then word line 1254, etc.) during a given programming/erase cycle. However, depicted in FIG. 10 is the current state of section 1200 subsequent to a programming operation of a particular programming/erase cycle, wherein only two word lines 1250 and 1252 are in a programmed state, and memory cells 1214 and 1216 at word lines 1254 and 1256 are unprogrammed and, therefore, remain in an "erased" state. Therefore, as shown in FIG. 10, at memory cell 1210, a number of electron charges 1260 are present at charge trapping layer 1230, in accordance with a programmable state. Similarly, at memory cell 1212, a number of electron charges 1262 are present at charge trapping layer 1230, in accordance with a programmable state. Further, in this particular embodiment, the programmable state of memory cell 1212 is a higher programmable state than the programmable state of memory cell 1210. Thus, as illustrated in FIG. 10, the number of electron charges 1262 that are present at memory cell 1212 exceeds the number of electron charges 1260 present at memory cell 1210.

Figure 11:
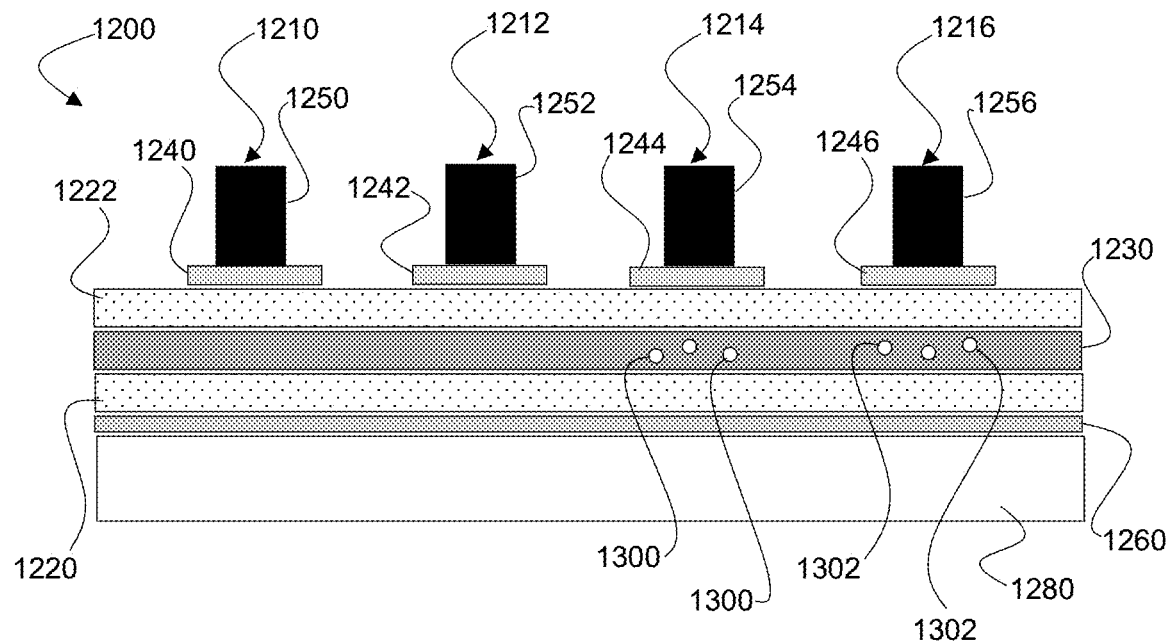
FIG. 11 schematically depicts the section shown in FIG. 10 subsequent to an erase operation, in accordance with exemplary embodiments.

As discussed above, the memory block that comprises the representative section 1200 may be characterized as an "open" memory block as a result of the partial programming that occurred during this particular programming/erase cycle. Referring now to FIG. 11, there is depicted a current state of the representative section 1200 of FIG. 10 as a result of an erase operation occurring after the programming operation shown in FIG. 10, and within the same programming/erase cycle depicted in FIG. 10. As described in detail above, in order to perform an erase operation of a memory block, a relatively high erase biasing voltage (VERA) that, according to certain exemplary embodiments, is within the approximate range of 20 volts to 25 volts, may be applied to the channel region (e.g., the channel 1260 in FIGS. 10 and 11) of the memory block. In addition, a relatively low voltage (VERA_WL) may be applied to the word line(s) of the memory block. In certain exemplary embodiments, this voltage (VERA_WL) that is applied to the word line(s) may be within an approximate range of, for example, 0.5 volts to 2.0 volts. A significant electrical potential is created as a result of the considerable voltage difference between the erase biasing voltage (VERA) that is applied to the channel region and the voltage (VERA_WL) that is applied to the word line(s). This electrical potential causes the electron charges (e.g., the post-programming operation electron charges 1260, 1262 in FIG. 10) present at the charge trapping layer (e.g., charge trapping layer 1230 in FIGS. 10 and 11) to move or tunnel out of the charge trapping layer, thus placing the memory cells into an "erased" state.

As described in greater detail above, an erase operation is applied uniformly to the memory block, and to the entirety of the memory block at each erase operation, irrespective of whether the memory block is partially programmed (i.e., is an "open" memory block) or fully programmed (i.e., is a "closed" memory block). However, in the circumstance in which the memory block is an "open" memory block, the application of an electrical potential across a channel region of an unprogrammed memory cell in which there is an absence of programmed electron charges at the charge trapping layer, or significantly fewer electron charges that are present at the charge trapping layer in comparison to the electron charge populations of programmed memory cells, may cause several unintentional variations in the electrical characteristics or the electrical properties of the unprogrammed memory cell, which can lead to deviations in the electrical behavior of that memory cell. FIG. 11 depicts one example of an unintended shift in the electrical behavior of the unprogrammed memory cells 1214 and 1216 resulting from an erase operation uniformly applied to the entire memory block comprising representative section 1200. As depicted, the electron charges 1260, 1262 that were previously present at the programmed memory cells 1210 and 1212, have now vanished from the charge trapping layer 1230 as an intended result of the erase operation. Additionally however, as is depicted in FIG. 11, the applied electrical potential may unintentionally induce a number of positive charges 1300, 1302 to populate the charge trapping layer 1230 of the unprogrammed memory cells 1214 and 1216, respectively. Consequently, although the unprogrammed memory cells 1214 and 1216 are likewise considered to be in an "erased" state following the erase operation, the electrical parameters (e.g., threshold voltage ($V_{th}$) margin) corresponding to that "erased" state may now be skewed and, as a result, could cause a cascade of performance challenges.

Figure 12:
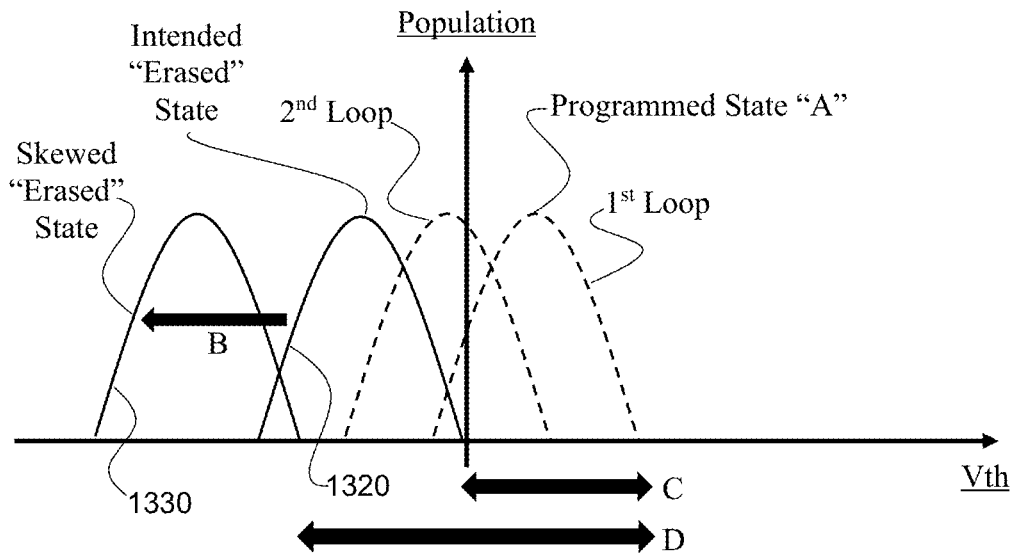
FIG. 12 is a distribution plot that depicts the effect of a "deep erase" condition on an erase operation that is performed with respect to a partially programmed three-dimensional NAND-type memory block, such as the type in FIG. 10, in accordance with exemplary embodiments.
Figure 13:
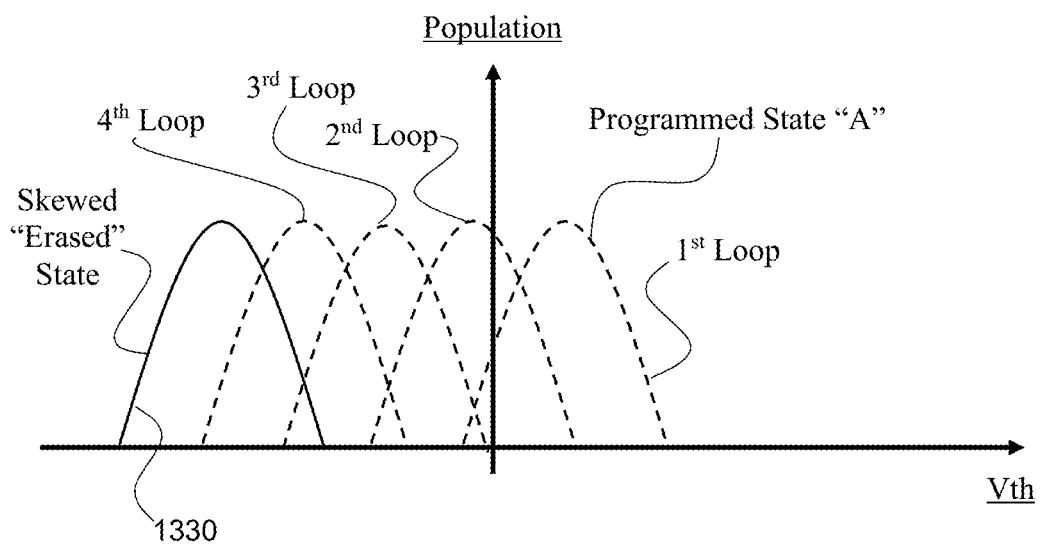
FIG. 13 is a distribution plot that depicts an erase operation with respect to a partially programmed three-dimensional NAND-type memory block, such as the type in FIG. 10, in accordance with exemplary embodiments.

Examples of some performance challenges that may potentially occur as a result of a skewed "erased" state that may be experienced by an unprogrammed memory cell following an erase operation are depicted in a generally basic manner in FIGS. 12 and 13. The distribution graph or plot set forth in FIG. 12 indicates generally a threshold voltage ($V_{th}$) distribution of an example population that is comprised of memory cells of a representative memory block. As indicated, according to this particular example, memory cells that are programmed to a "Programmed State 'A'" require two successive erase/verify loops to empty the memory cells' charge trapping layers (e.g., 1230 in FIG. 10) of the electron charge(s) that are present at the "Programmed State 'A'" in order to arrive at an intended "erased" state that is depicted at curve 1320. However, with respect to an unprogrammed memory cell, any induced positive charges present at its charge trapping layer as a result of the electrical potential created by the erase operation may cause a decrease in the threshold voltage ($V_{th}$) distribution margin of the unprogrammed memory cell, thereby skewing the "erased" state of the unprogrammed memory cell. Accordingly, as indicated in FIG. 12, the "erased" state of an unprogrammed memory cell experiences a leftward shift in the direction of arrow "B", as is depicted at curve 1330. This wholesale lower shift in the threshold voltage ($V_{th}$) distribution of the "erased" state of an unprogrammed memory cell may, therefore, be characterized or referred to as a "deep erase" condition.

As mentioned above, problematic ramifications may arise as a result of having a "deep erase" condition. Various examples are illustrated in a generalized manner in the distribution graph or plot that is provided in FIG. 13. For example, as a result of an unprogrammed memory cell having a skewed "erased" state, any future or prospective programming of the memory cell that may occur during a subsequent programming/erase cycle may be adversely affected. As depicted in FIG. 13, a "deep erase" condition of a memory cell may compound the requisite number of programming loops that are required to reach a programmed state. As shown in FIG. 12, a memory cell exhibiting an intended "erased" state has a narrower threshold voltage ($V_{th}$) distribution margin/range (see e.g., width "C" in FIG. 12) between its "erased" state and, for example, a "Programmed State 'A'", in comparison to the threshold voltage ($V_{th}$) distribution margin/range between a programmed state and a skewed "erased" state of the memory cell that has a lower directional shift in its "erased" state (see e.g., width "D" in FIG. 12). Accordingly, this widening of the threshold voltage ($V_{th}$) distribution margin/range relative to an "erased" state of a memory cell may necessitate an increase in the number of programming/verify loops. However, an increase in the number of the required programming/verify loops lengthens the amount of time of the programming operation, thereby impairing the efficiency of the memory device. Further, the added programming/verify loops places a higher stress and strain on the semiconductor materials of the memory device, thereby accelerating the wear and tear and, ultimately, the reliability and longevity of the memory device. In addition, the memory device will likely consume more power (e.g., ICC) due to these compensatory increases in the programming operation of the device.

Accordingly, the following description details certain exemplary embodiments of a mechanism that addresses, during the erase operation stage of a programming/erase cycle, the presence or the occurrence of a partially programmed (i.e., "open") memory block in order to prevent or to avoid a "deep erase" condition in which the "erased" state of an unprogrammed memory cell becomes skewed. As described in detail below, in order to achieve this goal, unprogrammed memory cell(s) of a given memory block are not subjected to the electrical potential applied during an erase operation by not applying any voltage (VERA_WL) to the unprogrammed word line(s) of the memory block. That is to say, the unprogrammed word line(s) are placed in a "float" condition such that the electrical potential generated across the unprogrammed memory cell, as produced by the application of an erase biasing voltage (VERA), is approximately zero (0) volts. As such, there is no electrical potential difference between the channel region (e.g., the channel region 1260 in FIGS. 10 and 11) and the charge trapping layer (e.g., the charge trapping layer 1230 in FIGS. 10 and 11) at the "floating" unprogrammed word line(s), thereby preventing the tunneling of any positive charges into the charge trapping layer. Thus, as a result, the unprogrammed memory cells do not experience any problematic shifts or changes in their threshold voltage ($V_{th}$) margin(s) as a result of the erase operation. However, with respect to the programmed memory cell(s) of the memory block, the erase operation proceeds as usual and without disturbance. The flow diagram in FIG. 14 provides a general outline of an exemplary embodiment of such a mechanism.

Figure 14:
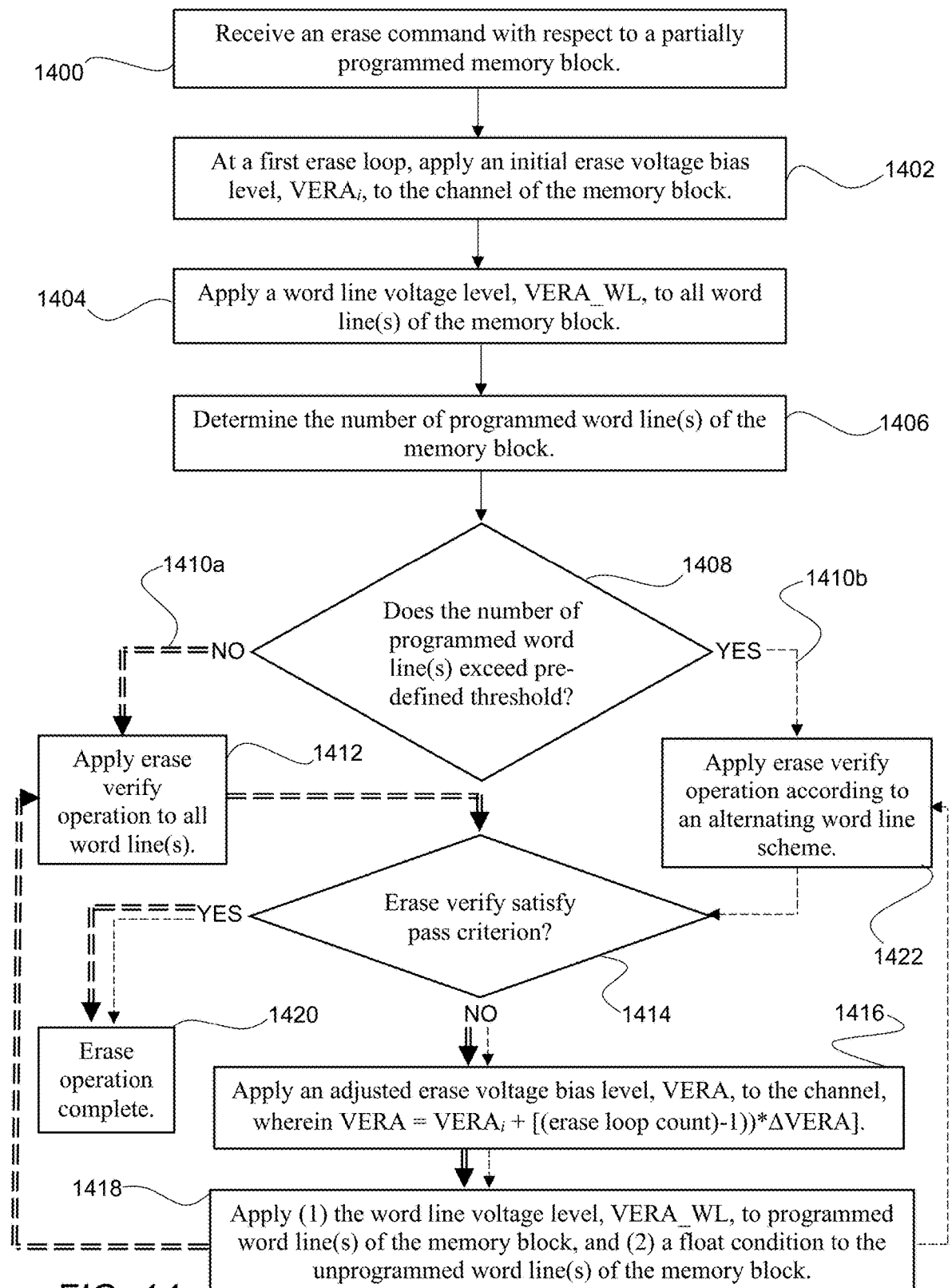
FIG. 14 is a flow diagram generally depicting an erase operation of a partially programmed memory block, in accordance with exemplary embodiments.

As depicted in FIG. 14, beginning at step 1400, an erase command is received with respect to a partially programmed memory block. Accordingly, at step 1402, an initial erase voltage bias level ($VERA_i$) is applied to the channel region of the memory block during a first erase loop. Thereafter, at step 1404, a voltage level (VERA_WL) is applied to all of the word line(s) of the memory block, irrespective of whether the word line(s) are programmed or unprogrammed. Importantly, as described below, it is only during this first erase loop that the word line voltage level (VERA_WL) is applied across the entire memory block. This relatively brief application of the word line voltage (VERA_WL) to all word line(s) of the block allows for the erasure of any possible electron charges lingering at the charge trapping layer of the unprogrammed memory cell(s) (see e.g., electron charges 1264 shown in FIG. 10) due to, for example, the occurrence of a read disturb (RD) condition or the presence of a data retention condition. Further, by and large, this minimal memory block-wide application of the word line voltage (VERA_WL) during, for example, just a single erase loop should not result in a "deep erase" condition of any memory cell.

Proceeding now to step 1406, an erase/verify operation commences to determine, as discussed in detail above, if the preceding erase loop sufficiently placed each and every memory cell of the memory block into an "erased" state according to, for example, a pass and/or fail criterion. In a starting step, an initial determination is made as to how many word line(s) of the memory block are currently in a programmed state. Thereafter, at step 1408, a determination is made as to whether the number of programmed word line(s) ascertained at step 1406 exceeds a pre-defined threshold. Further, this determination may be made by, for example, determining which word line of the memory block was the last to be programmed during the programming operation of the current programming/erase cycle. Based upon this determination, if the ascertained number of programmed word line(s) does not exceed the pre-defined threshold, the remainder of the erase operation continues into a loop 1410a, which is designated by a double-dashed line in FIG. 14. However, if the ascertained number of programmed word line(s) does exceed the pre-defined threshold, then the remainder of the erase operation instead enters a different loop 1410b, which is designated by a single-dashed line in FIG. 14.

Focusing initially on the remainder of the erase operation according to loop 1410a, an erase verify operation is applied to all word line(s) at step 1412. Thereafter, at step 1414, a determination is made as to whether the preceding erase verify operation indicates that a pass criterion is satisfied, thereby indicating a completed erase operation. If the pass criterion is satisfied, the erase operation is finished (see step 1420). However, if the pass criterion is not satisfied, a subsequent erase loop begins. Accordingly, an adjusted erase voltage bias level (VERA) is applied to the channel region of the memory block, wherein the initial erase voltage bias level (VERA$_i$) is increased by a pre-determined incremental voltage amount (ΔVERA) according to the following equation:

$$\text{VERA}=\text{VERA}_i+[(\text{erase loop count})-1))*\Delta\text{VERA}].$$

(See step 1416 in FIG. 14.) Next, at step 1418, the word line voltage level (VERA_WL) is then applied only to the programmed word line(s) of the memory block. Therefore, importantly, the word line voltage level (VERA_WL) is not applied to the unprogrammed word line(s) of the memory block, thereby placing the unprogrammed word line(s) in a "floating" condition. As discussed above, this "floating" condition isolates the unprogrammed memory cells from experiencing the significant electrical potential created by the application of the relatively high erase voltage bias level (VERA) to the channel of the memory block. Accordingly, the "deep erase" condition is largely avoided. Once the current erase loop is completed, the process then again returns to the erase verify operation at step 1412. Thus, this process proceeds through as many erase loops as is necessary until the erase verify operation indicates that the pass criterion has been met.

Figure 15:
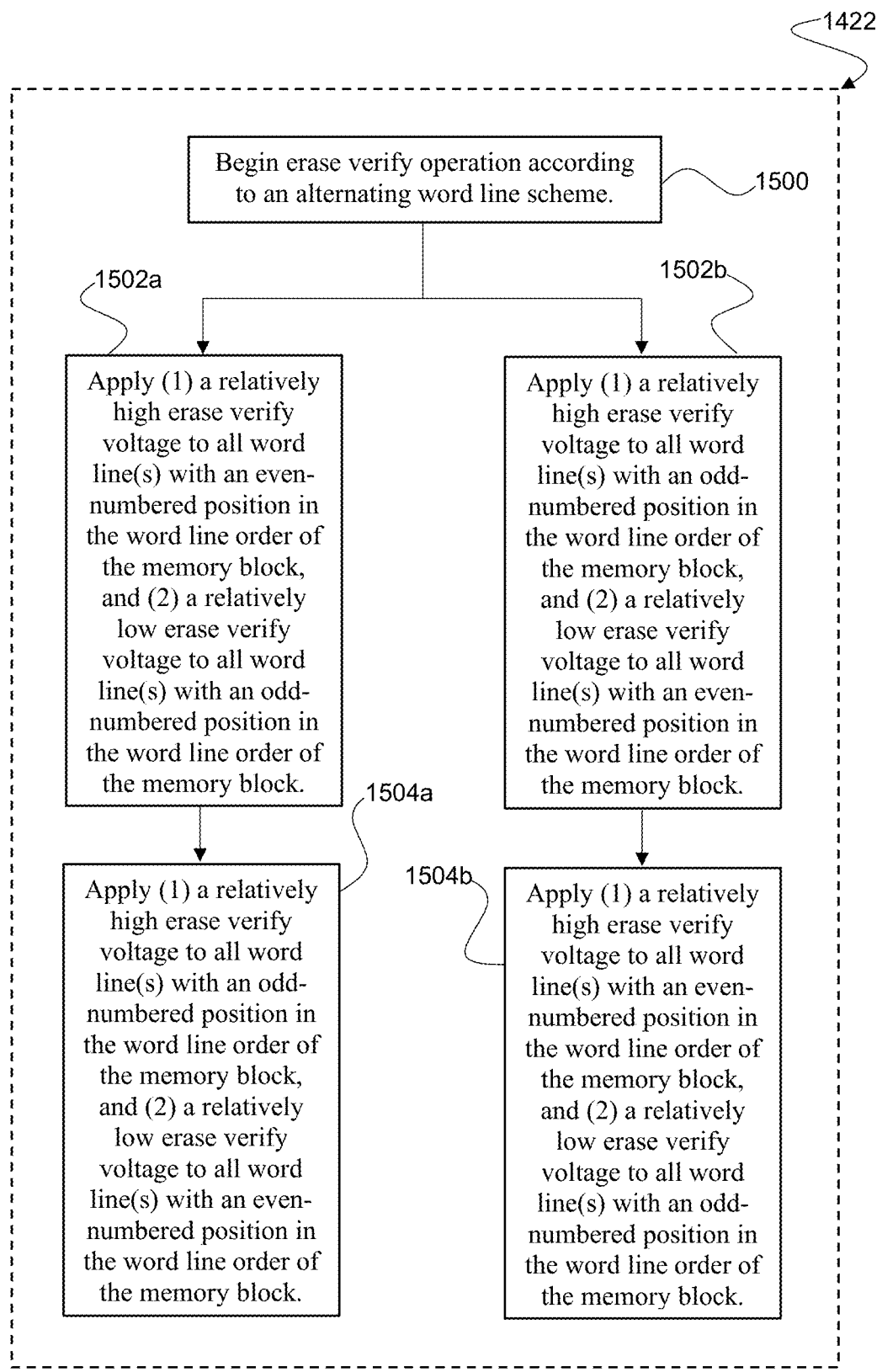
FIG. 15 is a flow diagram generally depicting an alternating erase verify process with respect to a memory block, in accordance with exemplary embodiments.

Returning now to the decision or determination point at step 1408 in the exemplary process set forth in FIG. 14, as discussed above, if the number of programmed word line(s) ascertained with respect to the memory block does not exceed a pre-defined threshold, the erase operation enters loop 1410a (indicated by a double-dashed line in FIG. 14). Conversely, as also depicted in the process in FIG. 14, in the circumstance in which the ascertained number of programmed word line(s) exceeds the pre-defined threshold, the erase operation enters an alternative loop 1410b (indicated by a single-dashed line in FIG. 14) in which there is a key difference between the erase operation that proceeds according to loop 1410a and the erase operation that proceeds according to loop 1410b. Namely, there is a distinction between the application of an erase verify operation according to loop 1410a (i.e., at step 1412) and the application of an erase verify operation according to loop 1410b. At step 1412, an erase verify operation is applied to all word line(s) of the memory block. By contrast, at step 1422 of loop 1410b, an erase verify operation is applied according to an alternating word line scheme. An exemplary embodiment of an alternating word line scheme of an erase verify operation is illustrated in further detail in the flow diagram set forth in FIG. 15.

Beginning at step 1500, an erase verify operation is first initiated according to an alternating word line scheme that comprises, for example, two steps. At step 1502a, a relatively high erase verify voltage (e.g., approximately between 4 volts and 7 volts) is applied to all word line(s) with an even-numbered position within a programming word line order. In addition, a relatively low erase verify voltage (e.g., approximately between 0.1 volts to 2 volts) is applied to all word line(s) with an odd-numbered position within the programming word line order. Subsequently, at step 1504a, the relatively high erase verify voltage is now applied to all word line(s) with an odd-numbered position within the programming word line order and, continuing onward, the relatively low erase verify voltage is applied to all word line(s) having an even-numbered position within the programming word line order.

Conversely, these two steps may be reversed in which the relatively high erase verify voltage is first applied to the word line(s) having an odd-numbered position within the programming word line order (see step 1502b) and, thereafter, the relatively high erase verify voltage is applied to the word line(s) with an even-numbered position within the programming word line order (see step 1504b).

This alternating word line erase verify scheme addresses a complication that may potentially arise in which the relatively low erase verify voltage that may ordinarily be applied uniformly to all word line(s) within a memory block (e.g., at step 1412 in loop 1410a) is not sufficient to adequately connect, electrically, the channel between two adjacent word lines. In such a circumstance, little to no current may be sensed at that region despite the possibility that there may exist some electron charges, thereby leading to a false pass determination during the erase verify operation. By applying the relatively high erase verify voltage to every other word line of the memory block, the necessary electrical potential is generated in order to accurately detect the sense current. The occurrence of an "open" memory block in which not all memory cells are programmed decreases the likelihood of a false erase verify pass determination. Accordingly, to promote efficiency and to conserve power, the utilization of an alternating word line erase verify scheme may be advantageously limited to only those instances in which, during a current programming/erase cycle, the memory block has reached a specific and pre-defined threshold number of programmed word line(s). This pre-defined threshold number may be optimized according to data and observations gathered experimentally and/or in situ. This threshold number may be specific to the particular memory device. Furthermore, according to some embodiments, this threshold number may be dynamically determined and might change throughout the life cycle of the memory device.

Still referring to the erase operation according to loop 1410*b* in the process depicted in FIG. 14, apart from this key difference in the type of erase verify operation applied at step 1422, the remainder of the erase operation (i.e., steps 1414, 1416, 1418, and 1420) is identical to that described with respect to the erase operation according to loop 1410*a*.

Importantly, it should be noted that, at step 1400, each programming/erase cycle of a given memory block may result in the memory block being partially programmed at different locations of the memory block. Therefore, in one programming/erase cycle, the specific word line(s) programmed may be different than the specific word line(s) programmed in a next programming/erase cycle. Accordingly, in applying the exemplary process set forth in FIG. 14, the specific erase operation conditions (i.e., whether or not to apply an erase voltage level (VERA_WL)) applied to a specific word line of the memory block will need to be newly-determined at each programming/erase cycle. In the circumstance in which word line(s) of a memory block are programmed according to a word line order, this determination may then be made by, for example, determining which word line of the memory block was last (or most recently) programmed.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for performing an erase operation with respect to a partially programmed memory block of a non-volatile memory structure, comprising:
    applying an erase voltage bias level to a channel of the memory block;
    applying a word line voltage level to all programmed word lines of the memory block;
    applying a float condition to all unprogrammed word lines of the memory block; and
    applying an erase verify operation to all word lines of the memory block.

2. The method according to claim 1, wherein the float condition comprises omitting application of the word line voltage level to the unprogrammed word lines.

3. The method according to claim 2, further comprising:
    prior to applying the float condition to the unprogrammed word lines of the memory block, at a first erase loop:
        applying an initial erase voltage bias level to the channel of the memory block;
        applying the word line voltage level to all word lines of the memory block;
        applying the erase verify operation to all word lines of the memory block; and
        determining whether the erase verify operation indicates that a pass criterion is satisfied.

4. The method according to claim 3, further comprising:
    if the pass criterion is not satisfied, entering a subsequent erase loop in which:
        an adjusted erase voltage bias level different from the initial erase voltage bias level is applied to the channel of the memory block;
        the word line voltage level is applied to all programmed word lines of the memory block; and
        the float condition is applied to all unprogrammed word lines of the memory block.

5. The method according to claim 1, wherein the step of applying an erase verify operation further comprises:
    determining whether a number of programmed word lines of the memory block exceeds a pre-defined threshold number; and
    if the pre-defined threshold number is:
        not exceeded, applying the erase verify operation to all word lines of the memory block; and
        exceeded, applying the erase verify operation according to an alternating word line scheme.

6. The method according to claim 5, wherein the step of determining whether the number of programmed word lines exceeds the pre-defined threshold number comprises determining which word line is the most recently programmed word line of the memory block.

7. The method according to claim 5, wherein the alternating word line scheme comprises applying:
    a relatively high erase verify voltage to all word lines of the memory block having an even-numbered position in a programming word line order of the memory block; and
    a relatively low erase verify voltage to all word lines of the memory block having an odd-numbered position in the programming word line order of the memory block.

8. The method according to claim 5, wherein the alternating word line scheme comprises applying:
    a relatively high erase verify voltage to all word lines of the memory block having an odd-numbered position in a programming word line order of the memory block; and
    a relatively low erase verify voltage to all word lines of the memory block having an even-numbered position in the programming word line order of the memory block.

9. A memory controller, comprising:
    a communication pathway configured to couple to a memory block of a non-volatile memory structure; and
    the memory controller is configured to:
        determine whether the memory block is partially programmed;
        if the memory block is determined to be partially programmed, initiate an erase operation with respect to the memory block by applying an erase voltage bias level to a channel of the memory block;
        apply a word line voltage level to all programmed word lines of the memory block;
        apply a float condition to all unprogrammed word lines of the memory block; and
        apply an erase verify operation to all word lines of the memory block.

10. The memory controller according to claim 9, wherein the float condition comprises omitting application of the word line voltage level to the unprogrammed word lines.

11. The memory controller according to claim 10, wherein the memory controller is further configured to:
    prior to application of the float condition to the unprogrammed word lines of the memory block, at a first erase loop:
        apply an initial erase voltage bias level to the channel of the memory block;

apply the word line voltage level to all word lines of the memory block;

apply the erase verify operation to all word lines of the memory block; and determine whether the erase verify operation indicates that a pass criterion is satisfied.

12. The memory controller according to claim 11, wherein the memory controller is further configured to:

if the pass criterion is not satisfied, enter a subsequent erase loop in which:

an adjusted erase voltage bias level different from the initial erase voltage bias level is applied to the channel of the memory block;

the word line voltage level is applied to all programmed word lines of the memory block; and the float condition is applied to all unprogrammed word lines of the memory block.

13. The memory controller according to claim 9, wherein the memory controller is further configured to:

in application of the erase verify operation:

determine whether a number of programmed word lines of the memory block exceeds a pre-defined threshold number; and if the pre-defined threshold number is:

not exceeded, apply the erase verify operation to all word lines of the memory block; and exceeded, apply the erase verify operation according to an alternating word line scheme.

14. The memory controller according to claim 13, wherein the alternating word line scheme comprises one of:

applying a relatively high erase verify voltage to all word lines of the memory block having an even-numbered position in a programming word line order of the memory block, and applying a relatively low erase verify voltage to all word lines of the memory block having an odd-numbered position in the programming word line order of the memory block; or applying a relatively high erase verify voltage to all word lines of the memory block having the odd-numbered position in a programming word line order of the memory block, and applying a relatively low erase verify voltage to all word lines of the memory block having the even-numbered position in the programming word line order of the memory block.

15. A non-volatile memory system, comprising:

a partially programmed memory block; and a memory controller coupled to the memory block, the memory controller:

initiating an erase operation with respect to the memory block;

applying an erase voltage bias level to a channel of the memory block;

applying a word line voltage level to all programmed word lines of the memory block;

applying a float condition to all unprogrammed word lines of the memory block; and applying an erase verify operation to all word lines of the memory block.

16. The non-volatile memory system according to claim 15, wherein the float condition comprises omitting application of the word line voltage level to the unprogrammed word lines.

17. The non-volatile memory system according to claim 16, further comprising the memory controller:

prior to applying the float condition to the unprogrammed word lines of the memory block, at a first erase loop:

applying an initial erase voltage bias level to the channel of the memory block;

applying the word line voltage level to all word lines of the memory block;

applying the erase verify operation to all word lines of the memory block; and determining whether the erase verify operation indicates that a pass criterion is satisfied.

18. The non-volatile memory structure according to claim 17, further comprising the memory controller:

if the pass criterion is not satisfied, entering a subsequent erase loop in which:

an adjusted erase voltage bias level different from the initial erase voltage bias level is applied to the channel of the memory block;

the word line voltage level is applied to all programmed word lines of the memory block; and the float condition is applied to all unprogrammed word lines of the memory block.

19. The non-volatile memory structure according to claim 15, further comprising the memory controller:

in applying the erase verify operation:

determining whether a number of programmed word lines of the memory block exceeds a pre-defined threshold number; and if the pre-defined threshold number is:

not exceeded, applying the erase verify operation to all word lines of the memory block; and exceeded, applying the erase verify operation according to an alternating word line scheme.

20. The non-volatile memory system according to claim 19, wherein the alternating word line scheme comprises one of:

applying a relatively high erase verify voltage to all word lines of the memory block having an even-numbered position in a programming word line order of the memory block, and applying a relatively low erase verify voltage to all word lines of the memory block having an odd-numbered position in the programming word line order of the memory block; or applying a relatively high erase verify voltage to all word lines of the memory block having the odd-numbered position in a programming word line order of the memory block, and applying a relatively low erase verify voltage to all word lines of the memory block having the even-numbered position in the programming word line order of the memory block.

* * * * *